(12) United States Patent
Nishihara

(10) Patent No.: US 6,486,591 B2
(45) Date of Patent: Nov. 26, 2002

(54) SURFACE ACOUSTIC WAVE DEVICE

(75) Inventor: Tokihiro Nishihara, Kawasaki (JP)

(73) Assignees: Fujitsu Media Devices Limited, Nagano (JP); Fujitsu Limited, Kawasaki (JP)

( * ) Notice: Subject to any disclaimer, the term of this patent is extended or adjusted under 35 U.S.C. 154(b) by 0 days.

(21) Appl. No.: 09/884,996

(22) Filed: Jun. 21, 2001

(65) Prior Publication Data
US 2002/0113526 A1 Aug. 22, 2002

(30) Foreign Application Priority Data
Dec. 14, 2000 (JP) .................................. 2000-380577

(51) Int. Cl.$^7$ .............................................. H01L 41/08
(52) U.S. Cl. .................................. 310/364; 310/313 R
(58) Field of Search ...................... 310/313 R, 313 A, 310/313 B, 363, 364, 366

(56) References Cited

U.S. PATENT DOCUMENTS

| 4,775,814 A | * | 10/1988 | Yuhara et al. ........... 310/313 R |
| 5,071,714 A | * | 12/1991 | Rodbell et al. ............. 428/620 |
| 5,773,917 A | * | 6/1998 | Satoh et al. ................ 310/364 |
| 5,844,347 A | * | 12/1998 | Takayama et al. ...... 310/313 R |
| 6,259,185 B1 | * | 7/2001 | Lai ........................ 310/313 B |
| 6,297,580 B1 | * | 10/2001 | Takayama et al. .......... 310/364 |

FOREIGN PATENT DOCUMENTS

| JP | 5-90268 A | 4/1993 |
| JP | 5-55618 | 7/1993 |
| JP | 5-183378 | 7/1993 |
| JP | 5-226337 | 9/1993 |
| JP | 5-90268 U | 12/1993 |
| JP | 7-122961 | 5/1995 |
| JP | 7-135443 | 5/1995 |
| JP | 7-52733 | 6/1995 |
| JP | 8-330892 | 12/1996 |
| JP | 8-340233 | 12/1996 |
| JP | 10-22764 | 1/1998 |
| JP | 10-93368 | 4/1998 |
| JP | 10-135767 | 5/1998 |
| JP | 2937613 | 6/1999 |
| WO | WO99/16168 | 4/1999 |

* cited by examiner

Primary Examiner—Mark O. Budd
(74) Attorney, Agent, or Firm—Armstrong, Westerman & Hattori, LLP

(57) ABSTRACT

A surface acoustic wave device comprising a substrate having a piezoelectric function on a surface thereof, and an electrode film having a four-layer structure comprising, from underneath, a first layer comprising Ti, a second layer comprising Al or an Al alloy, a third layer comprising an intermetallic compound, a silicide or a $CuAl_2$, and a fourth layer comprising Al or an Al alloy on the substrate.

13 Claims, 5 Drawing Sheets

SURFACE ACOUSTIC WAVE DEVICE

CROSS-REFERENCE TO RELATED APPLICATION

This application is related to Japanese application No. 2000-380577 filed on Dec. 14, 2000, whose priority is claimed under 35 USC §119, the disclosure of which is incorporated by reference in its entirety.

BACKGROUND OF THE INVENTION

1. Field of the Invention

The present invention relates to a surface acoustic wave (SAW) device. More particularly, the invention relates to a SAW device having been improved in electric power resistance. The SAW device of the invention can be preferably used, for example, as a SAW device (such as a resonator, an interstage filter and a duplexer) for a mobile communication terminal, such as a car telephone and a mobile phone.

2. Description of Related Art

In recent years, development of a mobile communication terminal, such as a car telephone and a mobile phone, of a small size and a light weight has been quickly advanced. According to the development, parts used in the mobile communication terminal are demanded to have a small size and high performance. Demands of a SAW device (such as a resonator, an interstage filter and a duplexer) contributing to the reduction of the size of a radio frequency (RF) section of the mobile communication terminal is therefore quickly extended.

An antenna duplexer, as one kind of the duplexer, is positioned at a front-end of the RF section and is required to have high electric power resistance. However, a dielectric device has been used therefore because the conventional SAW device has insufficient electric power resistance. Owing to the large size of the dielectric device, the RF section is inhibited from reduction in size.

In general, the SAW device has such a structure that contains a piezoelectric single crystal substrate, such as $LiNbO_3$, $LiTaO_3$ and quartz, having formed thereon interdigitated electrodes. As the interdigitated electrodes, Al (aluminum) or an Al alloy is widely used since they have excellent characteristics, i.e., a low resistance, a light weight and good property for microfabrication. When a high radio frequency signal of high electric power is applied to the SAW device, electric migration due to the radio frequency electric current and mechanical migration due to displacement of the SAW are liable to occur in Al constituting the interdigitated electrodes. It has been known that, as a result of the deterioration of the interdigitated electrodes thus caused, the characteristics of the SAW device are also deteriorated.

In order to improve the electric power resistance of the SAW device, various investigations have been conducted for the constitution of the electrodes. Among these, a technique using a Ti layer as the lowermost layer is receiving attention (described, for example, in Japanese Unexamined Patent Publication No. HEI 5(1993)-90268, Japanese Unexamined Patent Publication No. 10(1998)-93368 and International Patent Publication No. WO99/16168). According to the technique, it has been stated that the orientation of the Al or Al alloy layer is increased to suppress grain boundary diffusion of Al, and thus the migration resistance is improved, whereby the electric power resistance of the electrode film can be improved.

However, the above-mentioned technique in question has such a problem that the orientation of the Al or Al alloy layer is partially disturbed to cause scattering in electric, power resistance of the SAW devices. The grain boundary diffusion is liable to occur in the part where the orientation is disturbed, and the migration occurs from that part as the starting point. When the migration once occurs, the resistance of the part of migration is increased, and Joule's heat is caused at that part, whereby there finally arises a possibility of meltdown of the electrode film.

SUMMARY OF THE INVENTION

The invention relates to a SAW device comprising a substrate having a piezoelectric function on a surface thereof, and an electrode film having a four-layer structure comprising, from underneath, a first layer comprising Ti, a second layer comprising Al or an Al alloy, a third layer comprising an intermetallic compound, a silicide or a $CuAl_2$, and a fourth layer comprising Al or an Al alloy on the substrate.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
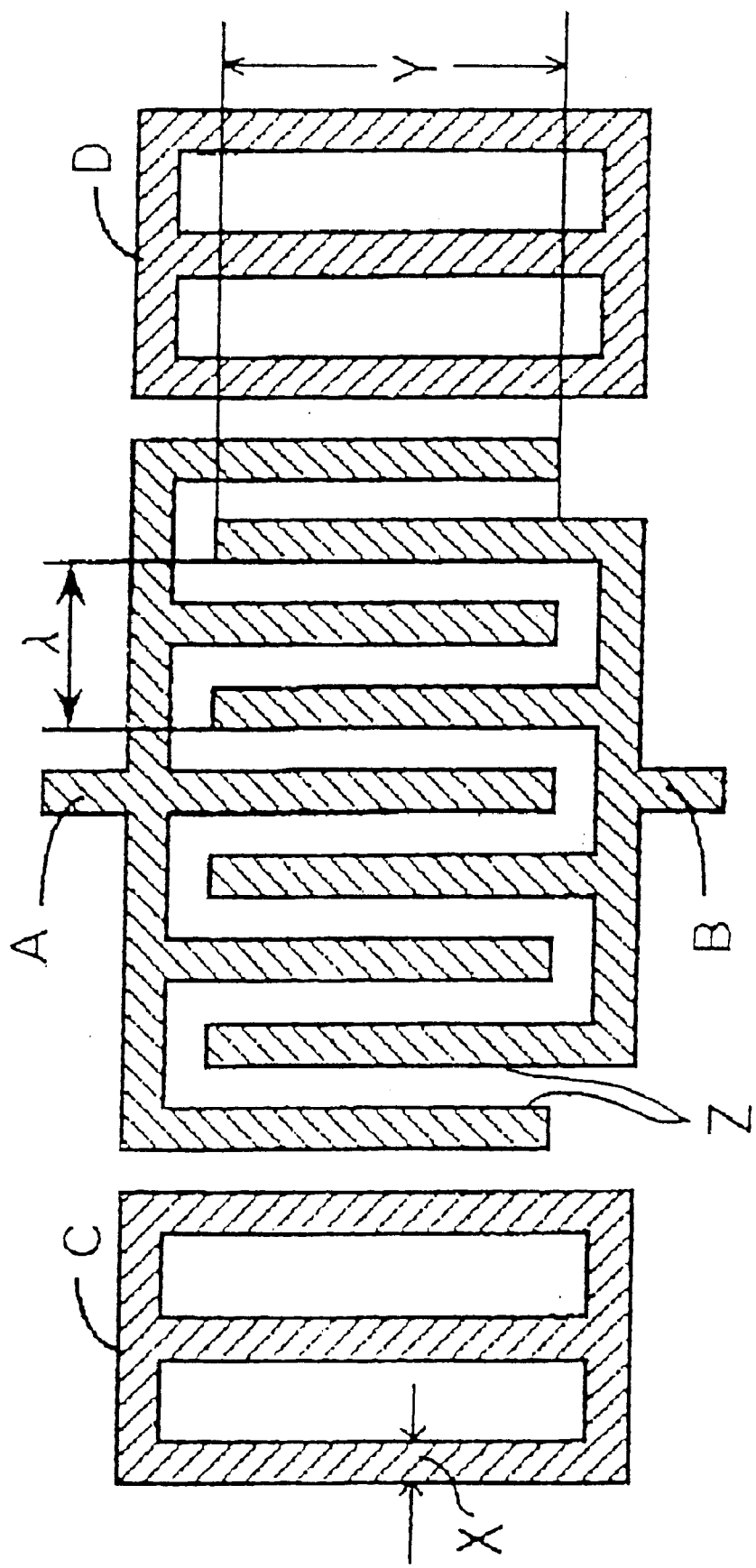
FIG. 1 is a schematic plane view of a constitution of a single terminal pair SAW resonator.

The invention will be described in detail below.

The SAW device of the invention comprises at least a substrate having a piezoelectric function on the surface and an electrode film formed on the surface.

The substrate that can be used in the invention is not particularly limited as far as it can be used as a SAW device, and examples thereof include a piezoelectric single crystal substrate, such as an $LiNbO_3$ substrate, an $LiTaO_3$ substrate and a quartz substrate. In addition to these substrates, such constitutions may be included in that a high sonic speed propagation substrate, such as a sapphire substrate and an Si substrate having a diamond film, having formed thereon a piezoelectric thin film, such as ZnO and AlN.

The electrode film is formed on the substrate. The electrode film of the invention has a four-layer structure comprising, from underneath, a first layer comprising Ti, a second layer comprising Al or an Al alloy, a third layer, and a fourth layer comprising Al or an Al alloy.

Examples of the Al alloy constituting the second layer and the fourth layer include alloys of Al having added thereto at least Cu, Mg, Pd, Ti or Si. The proportion of the additive in the Al alloy can be appropriately elected depending on the species of the additive, and is preferably 5% by weight or less. When it exceeds 5% by weight, it is not preferred since the resistance of the electrode film is increased to cause increase in loss of the SAW device. The amount of the additive in the electrode film can be quantitatively analyzed, for example, by ICP-AES (inductively coupled plasma atomic emission spectrometry).

The third layer comprises an intermetallic compound, a silicide or a $CuAl_2$. The inventors have found the following. Because the third layer is harder than an Al single layer film, when the third layer is inserted between the second layer and the fourth layer each comprising Al or an Al alloy, the grain boundary diffusion of Al can be prevented by the third layer even though the partial disturbance in orientation is present in the second layer or the fourth layer. As a result, the migration resistance can be improved. The invention will be described for each species of the third layer.

Intermetallic Compound Layer

Examples of the intermetallic compound layer include a layer comprising an intermetallic compound containing Al and other metals as main components. The term "main component" herein means that the total amount of Al and other metals is 50% by weight or more in the layer. A high melting point metal having a melting point of 1,500° C. or more is preferably used as the metal other than Al. Examples of the high melting point metal include Ti, W and Ta. More specifically, examples thereof include $TiAl_3$, TiAl, $Ti_3Al$, $Al_{12}W$ and $Al_3Ta$.

Because frequency shift occurs in a SAW device due to the mass addition effect, it is necessary that the mass of the electrode be set at the predetermined value. Ti and the intermetallic compound have a larger density than Al and the Al alloy. Ti and the intermetallic compound have a larger specific resistance than Al and the Al alloy. Therefore, it is preferred that the values of the thickness of the respective layers are determined with consideration of these characteristics.

Specifically, it is preferred that the first layer of Ti has a thickness of more, than 0% to 50% or less of the total thickness of the electrode film. More preferably, it is in a range of from 5 to 30%.

In the case where the third layer comprises $TiAl_3$, TiAl or $Al_{12}W$, the thickness thereof is preferably from more than 0% to 40% or less of the total thickness of the electrode film. More preferably, it is in a range of from 5 to 25%. In the case where the third layer comprises $Ti_3Al$, the thickness thereof is preferably from more than 0% to 30% or less of the total thickness of the electrode film. More preferably, it is in a range of from 5 to 20%. In the case where the third layer comprises $Al_3Ta$, the thickness thereof is preferably from more than 0 to 20% or less of the total thickness of the electrode film. More preferably, it is in a range of from 5 to 15%.

When the values of the thickness of the first layer and the third layer are larger than the ranges, it is not preferred since the resistance of the electrode film is increased, so as to cause the possibility of increase of the insertion loss of the SAW device.

The percentages of the thickness of the first, second, third and forth films with respect to the total thickness of the electrode film sum up to 100%.

Silicide Layer

As the silicide layer, a layer of a silicide contains a high melting point metal having a melting point of 1,500° C. or more and Si as main components. The term "main component" herein means that the total amount of the high melting point metal and Si is 50% by weight or more in the layer. Examples of the high melting point metal include Ti, W, Ta and Mo. More specifically, examples thereof include $TaSi_2$, $WSi_2$, $TiSi_2$ and $MoSi_2$.

In the case of the silicide layer, it is also preferred that the values of the thickness of the respective layers constituting the electrode film are determined in the manner similar to the intermetallic compound layer.

Specifically, it is preferred that the first layer of Ti has a thickness of more than 0% to 50% or less of the total thickness of the electrode film. More preferably, it is in a range of from 5 to 30%.

In the case where the third layer comprises $TiSi_2$, the thickness thereof is preferably from more than 0% to 40% or less of the total thickness of the electrode film. More preferably, it is in a range of from 5 to 25%. In the case where the third layer comprises $MoSi_2$, the thickness thereof is preferably from more than 0% to 30% or less of the total thickness of the electrode film. More preferably, it is in a range of from 5 to 20%. In the case where the third layer comprises $TaSi_2$ or $WSi_2$, the thickness thereof is preferably from more than 0% to 20% or less of the total thickness of the electrode film. More preferably, it is in a range of from 5 to 15%.

When the values of the thickness of the first layer and the third layer are larger than the ranges, it is not preferred since the resistance of the electrode film is increased, so as to cause the possibility of increase of the insertion loss of the SAW device.

$CuAl_2$ Layer

In the case of the $CuAl_2$ layer, it is also preferred that the values of the thickness of the respective layers constituting the electrode film are determined in the manner similar to the intermetallic compound layer. The $CuAl_2$ layer is a layer of an intermetallic compound of 54.1% by weight of Cu and 45.9% by weight of Al.

Specifically, it is preferred that the first layer of Ti has a thickness of more than 0% to 50% or less of the total thickness of the electrode film. More preferably, it is in a range of from 5 to 30%. The thickness of the third layer of the $CuAl_2$ layer is preferably from more than 0% to 40% or less of the total thickness of the electrode film. More preferably, it is in a range of from 5 to 25%. When the values of the thickness of the first layer and the third layer are larger than the ranges, it is not preferred since the resistance of the electrode film is increased, so as to cause the possibility of increase of the insertion loss of the SAW device.

The first layer, the second layer, the third layer and the fourth layer may be formed by a known process, such as a DC magnetron sputtering process and an EB vapor deposition process, without particular limitation. It is preferred that the formation of the respective layers is conducted in vacuum. Furthermore, it is preferred that the formation of the first layer, the second layer, the third layer and the fourth layer is continuously in vacuum. When the formation is conducted in vacuum, increase of the resistance of the electrode film due to an oxide film formed at interfaces of the layers can be prevented.

In the case where the $CuAl_2$ layer is used as the third layer, the $CuAl_2$ layer can also be formed in the following manner in addition to the manner of directly forming the $CuAl_2$ layer. That is, a Cu layer is formed instead of the $CuAl_2$ layer, and after forming the fourth layer, the electrode film is subjected to a heat treatment at a temperature of from 150 to 350° C. to diffuse Al from the second layer and the fourth layer to the third layer, whereby the $CuAl_2$ layer is formed. The heat treatment can be conducted in any stage after forming all the layers, and it can be effected by some production step until the completion of packaging of the SAW device (for example, a sealing step of the device) and also can be replaced by the thermal history during the production process.

The heat treatment is preferably conducted in an inert gas atmosphere or in vacuum. This is because oxidation of the film surface during the heat treatment is prevented.

The electrode film is then generally patterned to a desired shape. The process of patterning is not particularly limited, and any known etching process can be used. Specific examples thereof include such a process that a resist pattern corresponding to the desired shape is formed, and patterning is effected by a dry etching process, such as reactive ion etching, using the pattern as a mask, followed by ashing the resist pattern.

It is preferred that the electrode film is covered with an insulating film, such as an $SiO_2$ film and an SiN film. Good electric insulation characteristics can be obtained by the insulating film, so as to prevent chemical corrosion upon cutting. The insulating film can be formed by a known process, such as a sputtering process and a CVD process.

In the case where the SAW device is used as a filter (hereinafter referred to as a SAW filter), the following constitution can be employed.

The SAW filter can be designed by a mode, such as a ladder type, a transversal type and a mode coupling type. Among these, the ladder type SAW filter is preferred since it has a large number of pairs of electrodes with a low electric current density per one electrode finger and is excellent in electric power resistance.

FIG. 1 is a schematic plane view of a constitution of a single terminal pair SAW resonator as a basic constitutional element of the ladder type SAW filter. It is understood from the figure that the SAW resonator is generally constituted with two reflectors (C and D) and a pair of interdigitated electrodes (A and B).

In the ladder type SAW filter, the SAW resonator shown in FIG. 1 is connected to adjacent SAW resonators in parallel and/or series. That is, plural first single terminal pair SAW resonators (for example, P1 and P2 in FIG. 2) having a prescribed resonance frequency are arranged on a parallel arm, and plural second single terminal pair SAW resonators (for example, S1 to S4 in FIG. 2) having a resonance frequency, which substantially agree with the anti-resonance frequency of the first single terminal pair SAW resonators, are arranged on a series arm. The period λ of interdigitated electrodes of the SAW resonators arranged on the parallel arm (hereinafter referred to as parallel arm SAW resonators) and that of the SAW resonators arranged on the series arm (hereinafter referred to as series arm SAW resonators) are preferably different from each other for differentiating the resonance frequencies.

More specifically, in the case where a 42° Y-cut X-propagation $LiTaO_3$ substrate is used in a 800 MHz band filter, a transmission filter for AMPS (advanced mobile phone. system) preferably has λ for the parallel arm SAW resonators of from 4.68 to 4.92 μm and λ for the series arm SAW resonators of from 4.58 to 4.72 μm. In the case where it is used as a reception filter for AMPS, it preferably has λ for the parallel arm SAW resonators of from 4.40 to 4.64 μm and λ for the series arm SAW resonators of from 4.20 to 4.44 μm. The width X of the interdigitated electrodes is generally ¼ of λ.

In the case of the 800 MHz band filter, the opening length Y of the SAW resonators is preferably from 60 to 120 μm for the parallel arm SAW resonators and from 40 to 80 μm for the series arm SAW resonators.

In the case of the 800 MHz band filter, the number of pairs of the interdigitated electrodes Z is preferably from 40 to 120 parts for the parallel arm SAW resonators and from 60 to 130 parts for the series arm SAW resonators.

The constitution of the electrodes of the SAW resonators shown in FIG. 1 is a mere example for describing the invention, and the invention is not limited to the constitution shown in the figure.

The SAW device according to the invention can be used as, in addition to a filter, for example, a resonator, a delay line, an oscillator, a matched filter, an acoustic optical device and a convolver.

EXAMPLES

The invention will be described in more detail with reference to the following examples, but the invention is not construed as being limited thereto.

Specific design conditions of electrodes of a SAW device used in the example will be described. The SAW device is an antenna duplexer for AMPS. The duplexer is constituted with a transmission filter (band: 824 to 849 MHz) and a reception filter (band: 869 to 894 MHz). In the example, evaluation of electric power resistance was conducted for the transmission filter, to which larger electric power was applied.

Figure 2:
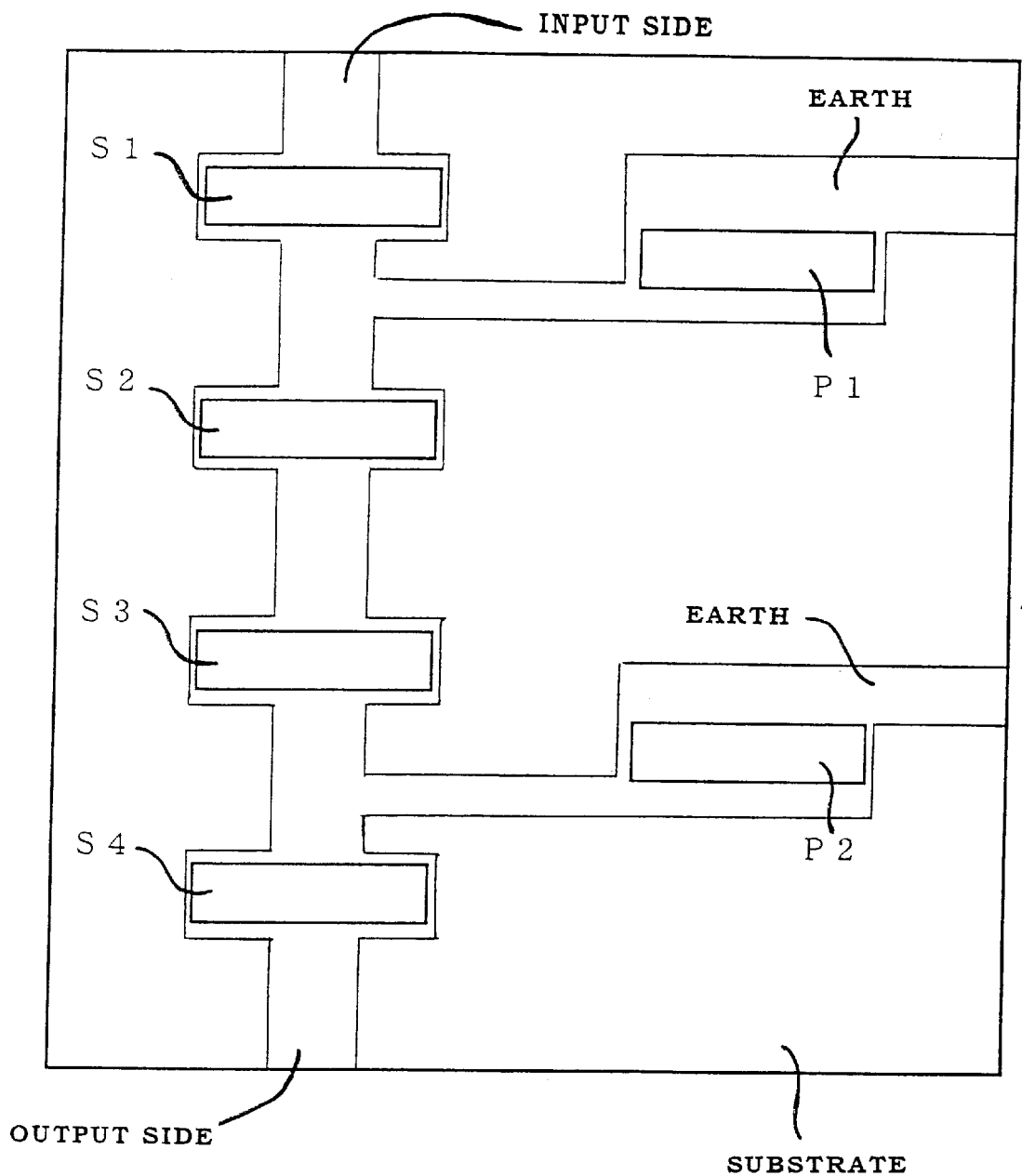
FIG. 2 is a schematic plane view illustrating a ladder type filter having a SAW device of the present invention.

The design of the electrodes was a so-called ladder type filter. It is constituted with plural single terminal pair SAW resonators, each of which comprises an interdigitated electrodes and reflectors arranged on both ends thereof, are arranged on a series arm and a parallel arm, respectively, as shown in FIG. 2. Specifically, the series resonators (S1 to S4) and the parallel resonators (P1 and P2) were arranged in the order from the input side, S1, P1, S2, S3, P2 and S4. The resonator S1 had an opening length of 50 μm, a number of pairs of 95 and a period of 4.60 μm, the resonators S2 to S4 each had an opening length of 100 μm, a number of pairs of 95 and a period of 4.60 μm, and the resonators P1 and P2 had an opening length of 120 μm, a number of pairs of 95 and a period of 4.80 μm. The width of the interdigitated electrode was ¼ of the period.

A 42° Y-cut X-propagation $LiTaO_3$ substrate was used as the piezoelectric substrate. The thickness of the electrode film was 440 nm for an Al single layer film and was appropriately adjusted for other materials constituting the layers with consideration of the specific gravity of the materials. Values of specific gravity with respect to Al of the materials that can constitute the electrode film of the invention, such as various kinds of intermetallic compounds and silicides, are shown in Table 1 below. The necessary thickness of the respective layers of the electrode film was determined by using the values shown in Table 1. When the specific gravity of the materials constituting the electrode film is more than 1, the total thickness of the electrode film is smaller than that of the Al single layer film, and when the specific gravity is less than 1, the total thickness is larger than the Al single layer film.

TABLE 1

| | Specific gravity with respect to Al |
|---|---|
| Ti | 1.34 |
| $Al_3Ti$ | 1.09 |
| AlTi | 1.17 |
| $AlTi_3$ | 1.26 |
| $Al_{12}W$ | 1.36 |
| $Al_3Ta$ | 1.98 |
| $TaSi_2$ | 2.10 |
| $WSi_2$ | 2.37 |
| $MoSi_2$ | 1.47 |
| $TiSi_2$ | 0.90 |
| $CuAl_2$ | 1.55 |

Example 1

Figure 3:
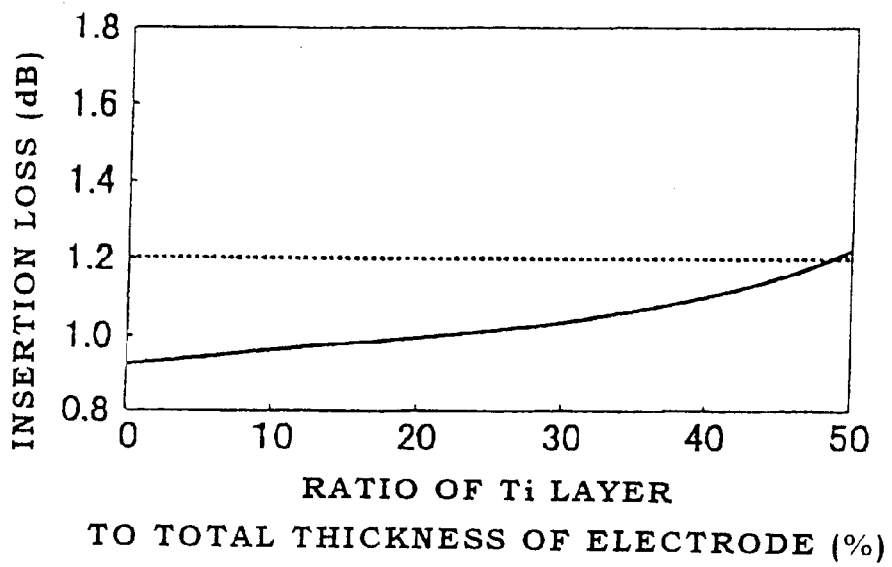
FIG. 3 is a graph illustrating a relationship between a ratio of a Ti layer to a total thickness of the electrode and an insertion loss.

In an electrode film having a two-layer structure of Ti layer/Al-1%Cu layer from the substrate side, a minimum insertion loss of a transmission filter was measured where the thickness of the Ti layer was changed. The results are shown in FIG. 3. In order to satisfy the requirements of a transmission filter, the loss is necessarily suppressed to 1.2 dB or less. It is understood from FIG. 3 that in order to attain 1.2 dB or less, the thickness of the Ti layer is preferably 50% or less with respect to the total thickness of the electrode film as 100%.

Figure 4:
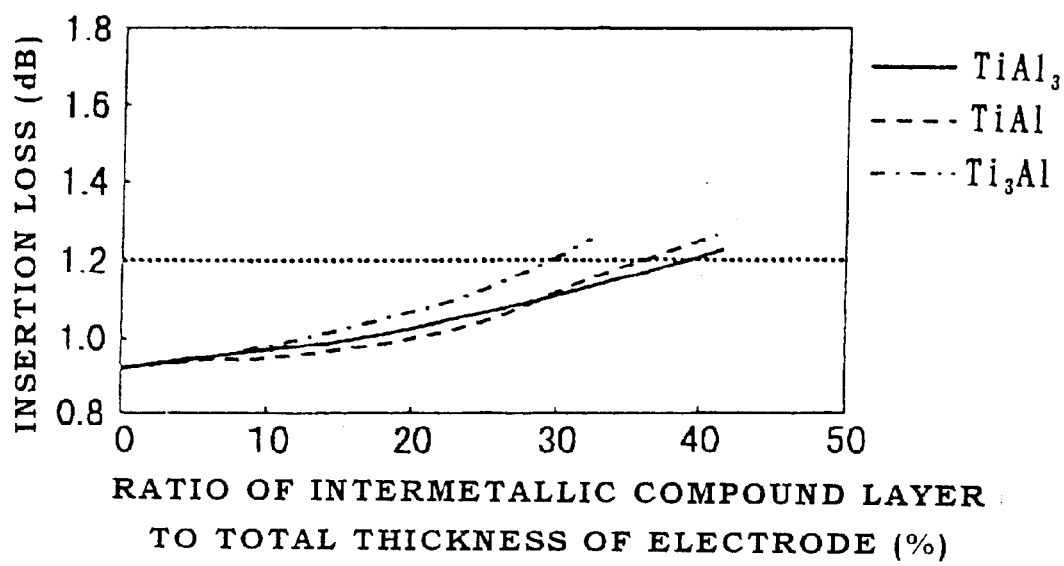
FIG. 4 is a graph illustrating a relationship between a ratio of an intermetallic compound layer to a total thickness of the electrode and an insertion loss.
Figure 5:
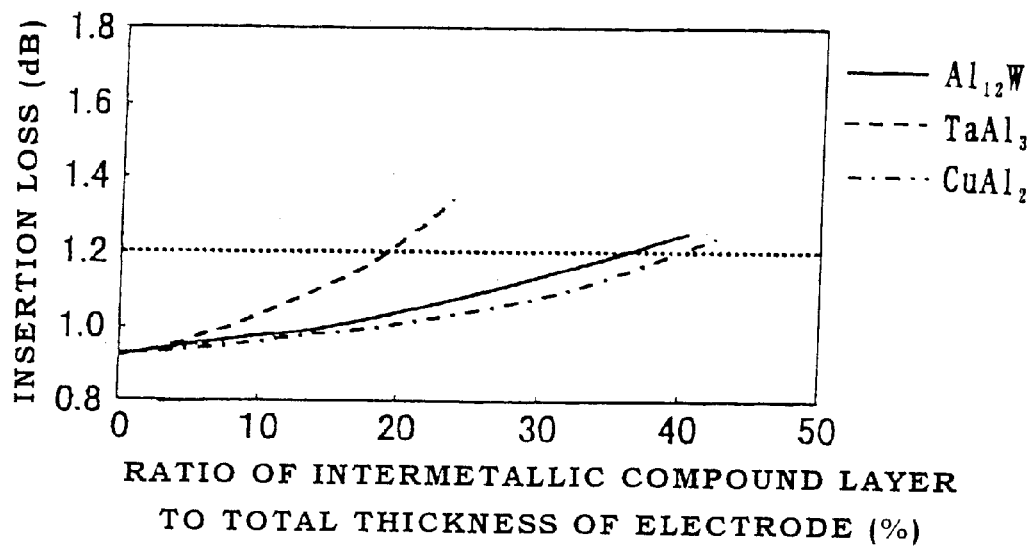
FIG. 5 is a graph illustrating a relationship between a ratio of an intermetallic compound layer to a total thickness of the electrode and an insertion loss.
Figure 6:
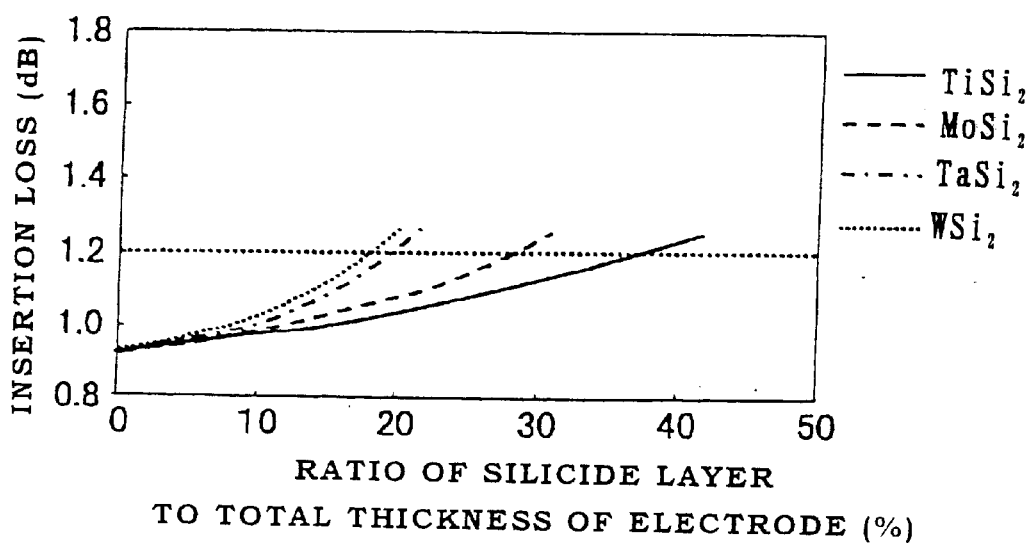
FIG. 6 is a graph illustrating a relationship between a ratio of a silicide layer to a total thickness of the electrode and an insertion loss.

In an electrode film having a three-layer structure of Al-1%Cu layer/(intermetallic compound layer, silicide layer or $CuAl_2$ layer)/Al-1%Cu layer from the substrate side, a minimum insertion loss of a transmission filter was measured where the thickness of the intermetallic compound layer, the silicide layer or the $CuAl_2$ layer was changed. The results are shown in FIGS. 4 to 6. In order to satisfy the requirements of a transmission filter, the loss is necessarily suppressed to 1.2 dB or less. It is understood from FIGS. 4 to 6 that in order to attain 1.2 dB or less, the thickness of the layer comprising $TiAl_3$, TiAl, $Al_{12}W$, $TiSi_2$ or $CuAl_2$ is preferably 40% or less with respect to the total thickness of the electrode film as 100%, the thickness of the layer comprising $Ti_3Al$ or $MoSi_2$ is preferably 30% or less, and the thickness of the layer comprising $Al_3Ta$, $TaSi_2$ or $WSi_2$ is preferably 20% or less.

Example 2

Figure 7:
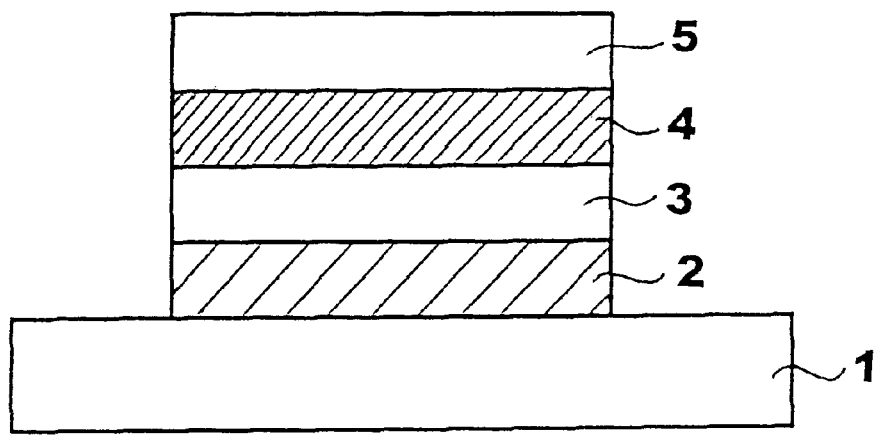
FIG. 7 is a schematic plane view of a constitution of a single terminal pair SAW resonator.

Electrode films having the constitution shown in FIG. 7 and compositions and thickness shown in Table 2 were formed by a DC magnetron sputtering process to prepare transmission filters, which were measured for service life thereof. The term "service life" herein means a period of time until the characteristics of the transmission filter are deteriorated, and specifically, a period of time when the band width is decreased from the initial value by 2 MHz or more. The measurement conditions were an environmental temperature of 85° C., an application frequency of 849 MHz, which was the lowest region in the band of a transmission filter, and applied electric power of 1.2 W. The measured service lives are shown in Table 2. In FIG. 7, numeral 1 denotes the substrate, 2 denotes the first layer, 3 denotes the second layer, 4 denotes the third layer, and 5 denotes the fourth layer.

The electric power resistance of a SAW device can be evaluated by measuring a service life when arbitrary electric power is applied to the device. As described in the foregoing, when electric power exceeding a certain level is applied to the SAW device, migration occurs in an interdigitated electrode of Al or an alloy thereof, and the electrode is fused by the migration further proceeding. Consequently, because the band width of the SAW device is decreased along with progress of the migration, the service life, i.e., the electric power resistance, of the SAW device can be evaluated by monitoring the band width being decreased.

TABLE 2

| No. | Constitution of electrode film (thickness) | | | | Service life (hr) | Remarks |
|---|---|---|---|---|---|---|
| 1 | Al-1% Cu (440 nm) (single layer) | | | | 6 | conventional constitution |

| No. | First layer | Second layer | Third layer | Fourth layer | Sevice life (hr) | Remarks |
|---|---|---|---|---|---|---|
| 2 | Ti (40 nm) | Al-1% Cu (161 nm) | $TiAl_3$ (60 nm) | Al-1% Cu (161 nm) | 58,100 | Third layer: intermetallic compound layer |
| 3 | Ti (40 nm) | Al-1% Cu (158 nm) | TiAl (60 nm) | Al-1% Cu (158 nm) | 52,900 | |
| 4 | Ti (40 nm) | Al-1% Cu (155 nm) | $Ti_3Al$ (60 nm) | Al-1% Cu (155 nm) | 28,600 | |
| 5 | Ti (40 nm) | Al-1% Cu (152 nm) | $Al_{12}W$ (60 nm) | Al-1% Cu (152 nm) | 12,300 | |
| 6 | Ti (40 nm) | Al-1% Cu (134 nm) | $TaAl_3$ 60 nm | Al-1% Cu (134 nm) | 4,200 | |
| 7 | Ti (40 nm) | Al-1% Cu (130 nm) | $TaSi_2$ (60 nm) | Al-1% Cu (130 nm) | 8,600 | Third layer: silicide layer |
| 8 | Ti (40 nm) | Al-1% Cu (122 nm) | $WSi_2$ (60 nm) | Al-1% Cu (122 nm) | 12,800 | |
| 9 | Ti (40 nm) | Al-1% Cu (149 nm) | $MoSi_2$ (60 nm) | Al-1% Cu (149 nm) | 3,200 | |
| 10 | Ti (40 nm) | Al-1% Cu (166 nm) | $TiSi_2$ (60 nm) | Al-1% Cu (166 nm) | 10,500 | |
| 11 | Ti (40 nm) | Al-1% Cu (147 nm) | $CuAl_2$ (60 nm) | Al-1% Cu (147 nm) | 43,200 | Third layer: $CuAl_2$ layer |
| 12 | Ti (40 nm) | Al-1% Cu (153 nm) | Ti (60 nm) | Al-1% Cu (153 nm) | 2,100 | conventional constitution |

In Table 2, Nos. 1 and 12 are electrodes having conventional constitutions. In more detail, the electrode No. 1 has such a constitution that has been generally employed, and the electrode No. 12 has such a constitution that has been proposed for improvement in electric power resistance of electrode No. 1. The constitution of the invention exhibits excellent electric power resistance in comparison not only to the electrode No. 1 having the conventional constitution but also to the electrode No. 12.

The constitution of the invention can be classified into the constitution using the intermetallic compound layer and the $CuAl_2$ layer as the third layer of Nos. 2 to 6 and 11 and the constitution using the silicide layer as the third layer of Nos. 7 to 10. The evaluation herein using the third layers of the same configuration reveals that the former constitution using the intermetallic compound layer and the $CuAl_2$ layer exhibit a long service life. However, the constitution using the silicide layer has other advantages as shown by Example 3 below.

Example 3

Electrode films having two kinds of four-layer constitutions, respectively, i.e., Ti/Al-1%Cu/$TiAl_3$/Al-1%Cu (electrode film A) and Ti/Al-1%Cu/$TiSi_2$/Al-1%Cu (electrode film B) were measured for service life when the thickness of the $TiAl_3$ layer or the $TiSi_2$ layer was changed as shown in Table 3. In order to maintain the center frequency of the transmission filters, the thickness of the Al-1%Cu film was adjusted to make the total weight of the electrode film be constant. The formation process and the measurement method of service life for the electrode films were the same as in Example 2. The results obtained are shown in FIG. 8.

TABLE 3

| | Conventional constitution | | Electrode film A | | | | Electrode film B | | | |
|---|---|---|---|---|---|---|---|---|---|---|
| | First layer Ti | Second layer Al-1% Cu | First layer Ti | Second layer Al-1% Cu | Third layer TiAl₃ | Fourth layer Al-1% Cu | First layer Ti | Second layer Al-1% Cu | Third layer TiSi₂ | Fourth layer Al-1% Cu |
| Thickness (nm) | 40 | 386 | 40 | 185 | 15 | 185 | 40 | 186 | 15 | 186 |
| | | | 40 | 177 | 30 | 177 | 40 | 180 | 30 | 180 |
| | | | 40 | 169 | 45 | 169 | 40 | 173 | 45 | 173 |
| | | | 40 | 161 | 60 | 161 | 40 | 166 | 60 | 166 |
| | | | 40 | 152 | 75 | 152 | 40 | 159 | 75 | 159 |
| | | | 40 | 144 | 90 | 144 | 40 | 153 | 90 | 153 |

Figure 8:
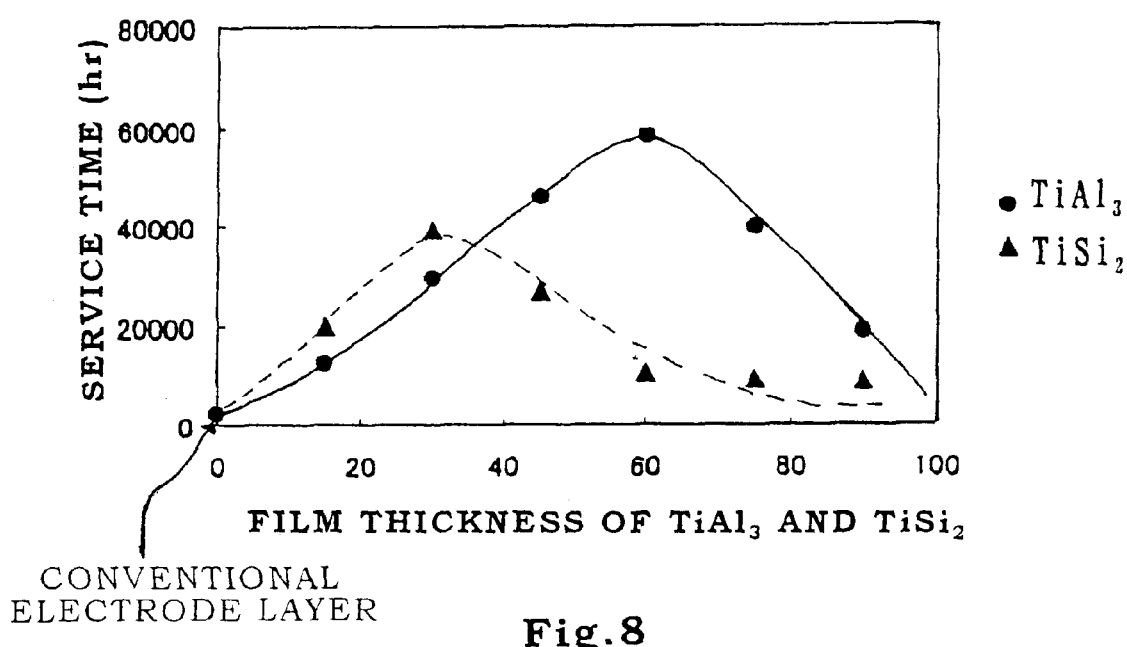
FIG. 8 is a graph illustrating a relationship between film thickness and service time of $TiAl_3$ and $TiSi_2$.

In FIG. 8, the case where the thickness as the abscissa is zero corresponds to the conventional constitution in Table 3. It is understood from FIG. 8 that the conventional constitution exhibits a service life of 2,400 hours, whereas the maximum service lives of the electrode films A and B are 58,100 hours (thickness: 60 nm) and 39,100 hours (thickness: 30 nm), respectively, which are considerably larger than the conventional constitution. The service life of the electrode film A becomes maximum when the thickness is 60 nm, whereas the service life of the electrode film B becomes maximum when the thickness is 30 nm. While the insertion loss of a transmission filter is increased along with increase of the thickness, the electrode film B can be used in the case where the electric power resistance is to be ensured with the insertion loss being suppressed.

The SAW device of the invention can be to suppress the scattering in electric power resistance caused by partial disturbance of the orientation in the case using the Ti layer as the lowermost layer, so as to improve the reliability of the electrode film.

According to the SAW device of the invention, the electric power resistance can be exponentially improved in comparison to the conventional SAW device. Consequently, application of a SAW device to an antenna duplexer can proceed, and reliability in application to the semi-microwave band can be increased.

What is claimed is:

1. A surface acoustic wave device comprising a substrate having a piezoelectric function on a surface thereof, and an electrode film having a four-layer structure on the substrate comprising, from underneath, a first layer comprising Ti, a second layer comprising Al or an Al alloy, a third layer comprising a silicide or CuAl₂, and a fourth layer comprising Al or an Al alloy.

2. A surface acoustic wave device as claimed in claim 1, wherein said third layer is a silicide layer containing Si and a high melting point metal having a melting point of 1,500° C. or more as main components.

3. A surface acoustic wave device as claimed in claim 2, wherein said high melting point metal is Ti, W, Ta or Mo.

4. A surface acoustic wave device as claimed in claim 3, wherein said third layer is a silicide layer comprising TaSi₂, WSi₂, TiSi₂ or MoSi₂.

5. A surface acoustic wave device as claimed in claim 4, wherein said first layer has a thickness of 50% or less of a total thickness of said electrode film, and said third layer has:

(1) a thickness of 20% or less of a total thickness of said electrode film in the case where said silicide layer comprises TaSi₂ or WSi₂;

(2) a thickness of 40% or less of a total thickness of said electrode film in the case where said silicide layer comprises TiSi₂; or (3) a thickness of 30% or less of a total thickness of said electrode film in the case where said silicide layer comprises MoSi₂.

6. A surface acoustic wave device as claimed in claim 1, wherein said first layer has a thickness of 50% or less of a total thickness of said electrode film, and said third layer comprising the CuAl₂ has a thickness of 40% or less of a total thickness of said electrode film.

7. A surface acoustic wave device as claimed in claim 1, wherein both said second layer and said fourth layer each is a layer comprising an Al alloy, and said Al alloy is an alloy comprising Al having added thereto at least Cu, Mg, Pd, Ti or Si.

8. A surface acoustic wave device comprising a substrate having a piezoelectric function on a surface thereof, and an electrode film having a four-layer structure on the substrate comprising, from underneath, a first layer comprising Ti, a second layer comprising Al or an Al alloy, a third layer comprising TiAl, Ti₃Al, Al₁₂W or Al₃Ta, and a fourth layer comprising Al or an Al alloy.

9. A surface acoustic wave device as claimed in claim 8, wherein said third layer is an intermetallic compound layer containing a high melting point metal having a melting point of 1,500° C. or more and Al as main components.

10. A surface acoustic wave device as claimed in claim 9, wherein said high melting point metal is Ti, W or Ta.

11. A surface acoustic wave device as claimed in claim 10, wherein said third layer is an intermetallic compound layer comprising the TiAl, Ti₃Al, Al₁₂W or Al₃Ta.

12. A surface acoustic wave device as claimed in claim 11, wherein said first layer has a thickness of 50% or less of a total thickness of said electrode film, and said third layer has:

(1) a thickness of 40% or less of a total thickness of said electrode film in the case where said intermetallic compound layer comprises TiAl₃ or TiAl;

(2) a thickness of 30% or less of a total thickness of said electrode film in the case where said intermetallic compound layer comprises Ti₃Al;

(3) a thickness of 40% or less of a total thickness of said electrode film in the case where said intermetallic compound layer comprises Al₁₂W; or (4) a thickness of 20% or less of a total thickness of said electrode film in the case where said intermetallic compound layer comprises Al₃Ta.

13. A surface acoustic wave device as claimed in claim 8, wherein both said second layer and said fourth layer each is a layer comprising an Al alloy, and said Al alloy is an alloy comprising Al having added thereto at least Cu, Mg, Pd, Ti or Si.

* * * * *